US012742064B2

(12) United States Patent
Lee et al.

(10) Patent No.: US 12,742,064 B2
(45) Date of Patent: Sep. 22, 2026

(54) ENCAPSULATION FILM

(71) Applicant: LG CHEM, LTD., Seoul (KR)

(72) Inventors: Seung Min Lee, Daejeon (KR); Yeong Bong Mok, Daejeon (KR); Sung Nam Moon, Daejeon (KR); Sang Min Park, Daejeon (KR); Hyun Suk Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 605 days.

(21) Appl. No.: 17/922,757

(22) PCT Filed: May 14, 2021

(86) PCT No.: PCT/KR2021/006095

§ 371 (c)(1),
(2) Date: Nov. 1, 2022

(87) PCT Pub. No.: WO2021/230717

PCT Pub. Date: Nov. 18, 2021

(65) Prior Publication Data

US 2023/0192980 A1 Jun. 22, 2023

(30) Foreign Application Priority Data

May 14, 2020 (KR) ........................ 10-2020-0057756
May 15, 2020 (KR) ........................ 10-2020-0058602

(51) Int. Cl.
*C08L 23/22* (2025.01)
*C08J 5/18* (2006.01)
(Continued)

(52) U.S. Cl.
CPC ................. *C08L 23/22* (2013.01); *C08J 5/18* (2013.01); *C08J 7/0427* (2020.01); *C09D 7/61* (2018.01);
(Continued)

(58) Field of Classification Search
CPC .. C08L 23/22; C08L 2203/16; C08L 2205/03; C08L 2205/06; C08J 5/18;
(Continued)

(56) References Cited

U.S. PATENT DOCUMENTS

2017/0077440 A1* 3/2017 Yoo ....................... C08F 255/10
2019/0006624 A1 1/2019 Yoon et al.

FOREIGN PATENT DOCUMENTS

CN 106795400 5/2017
CN 110731017 1/2020
(Continued)

*Primary Examiner* — Jay C Kim
*Assistant Examiner* — Woo K Lee
(74) *Attorney, Agent, or Firm* — Bryan Cave Leighton Paisner LLP

(57) ABSTRACT

The present application relates to an encapsulation film, an organic electronic device comprising the same, and a method for manufacturing an organic electronic device using the same, which provides an encapsulation film having excellent reliability that allows forming a structure capable of blocking moisture or oxygen flowing into an organic electronic device from the outside, absorbs and disperses the stress according to panel bending, while preventing generation of bright spots in the organic electronic device.

16 Claims, 1 Drawing Sheet

(51) Int. Cl.
*C08J 7/04* (2020.01)
*C09D 7/61* (2018.01)
*C09D 145/00* (2006.01)
*H10K 59/80* (2023.01)

(52) U.S. Cl.
CPC ......... *C09D 145/00* (2013.01); *H10K 59/873* (2023.02); *C08J 2323/22* (2013.01); *C08J 2423/22* (2013.01); *C08J 2435/02* (2013.01); *C08J 2445/00* (2013.01); *C08L 2203/16* (2013.01); *C08L 2205/03* (2013.01); *C08L 2205/06* (2013.01)

(58) Field of Classification Search
CPC .. C08J 7/0427; C08J 2323/22; C08J 2423/22; C08J 2435/02; C08J 2445/00; C09D 7/61; C09D 145/00; H10K 50/844; H10K 59/873
See application file for complete search history.

(56) References Cited

FOREIGN PATENT DOCUMENTS

| | | | |
|---|---|---|---|
| KR | 10-2014-0064395 | A | 5/2014 |
| KR | 10-1729889 | B1 | 4/2017 |
| KR | 10-2017-0050849 | A | 5/2017 |
| KR | 10-1772661 | B1 | 9/2017 |
| KR | 10-2018-0134776 | A | 12/2018 |
| KR | 10-2020-0026755 | A | 3/2020 |
| KR | 10-2020-0051271 | A | 5/2020 |

* cited by examiner

ENCAPSULATION FILM

CROSS-CITATION WITH RELATED APPLICATIONS

This application is a National Stage Application of International Application No. PCT/KR2021/006095, filed on May 14, 2021, which claims the benefit of priority based on Korean Patent Application No. 10-2020-0057756 filed on May 14, 2020 and Korean Patent Application No. 10-2020-0058602 filed on May 15, 2020, the disclosures of which are incorporated herein by reference in their entirety.

FIELD

The present application relates to an encapsulation film, an organic electronic device comprising the same, and a method for manufacturing the organic electronic device.

BACKGROUND

An organic electronic device (OED) means a device comprising an organic material layer that generates alternating current of charges using holes and electrons, and an example thereof may include a photovoltaic device, a rectifier, a transmitter and an organic light emitting diode (OLED), and the like.

The organic light emitting diode (OLED) among the above organic electronic devices has less power consumption and faster response speed than existing light sources, and is advantageous for thinning of a display device or illumination. In addition, the OLED has spatial usability and thus is expected to be applied in various fields covering various portable devices, monitors, notebooks, and TVs.

In commercialization and application expansion of the OLED, the most important problem is a durability problem. The organic materials and the metal electrodes, and the like included in the OLED are very easily oxidized by external factors such as moisture. In addition, there is also a problem that bright spots of the OLED are caused by the outgas that may occur inside the OLED device. That is, products comprising OLEDs are very sensitive to environmental factors.

In addition, stress occurs due to the bending of the panel at high temperatures, and this stress makes the penetration of external moisture or oxygen easy. Accordingly, various methods have been proposed in order to suppress the outgas generated inside, while effectively blocking penetration of oxygen or moisture from the outside into an organic electronic device such as OLED.

SUMMARY

The present application provides an encapsulation film having excellent reliability that allows forming a structure capable of blocking moisture or oxygen flowing into an organic electronic device from the outside, and absorbs and disperses the stress caused by panel bending, while preventing generation of bright spots in the organic electronic device.

The present application relates to an encapsulation film. The encapsulation film can be applied to encapsulation layer or encapsulating an organic electronic device such as, for example, OLEDs.

In this specification, the term "organic electronic device" means an article or device having a structure comprising an organic material layer that generates alternating current of charges using holes and electrons between a pair of electrodes facing each other, and an example thereof may include, but is not limited to, a photovoltaic device, a rectifier, a transmitter and an organic light emitting diode (OLED), and the like. In one example of the present application, the organic electronic device may be an OLED.

As shown in FIG. 1, an exemplary organic electronic element encapsulation film (1) may comprise an encapsulation layer (12) and a protective layer (11) formed on the encapsulation layer. The protective layer may have a coefficient of thermal expansion (CTE) within a range of 6 to 30 ppm/° C. The encapsulation layer may seal the top surface of an organic electronic element formed on a substrate. The substrate may also have a coefficient of thermal expansion of less than 8 ppm/° C. It is the main content of the present application to implement the desired reliability in the laminated structure. The encapsulation layer may have a strain value of less than 150% as measured, in a state prepared to a film sample having a thickness within a range of 750 to 850 μm, after applying to the film sample a vertical force of 200 gf at 85° C. using an 8 mm aluminum parallel plate cell in the Creep mode with ARES (TA), and applying a stress of 15,000 Pa to the film sample and maintaining it for 60 seconds. The upper limit of the strain value may be 148% or less, 145% or less, 143% or less, 140% or less, 100% or less, 80% or less, 60% or less, 50% or less, 45% or less, or 40% or less, and the lower limit thereof may be 5% or more, 10% or more, 15% or more, or 20% or more. The measurement of the physical properties is measured after preparing a sample by laminating one or more encapsulation layers to any one of thicknesses of 750 to 850 μm or 780 to 820 μm. The encapsulation layer for encapsulating the top surface of an organic electronic element is disposed between a substrate on which the element is formed and a protective layer. However, the materials of the substrate and the protective layer are different from each other, and accordingly the thermal expansion characteristics are also different. When the encapsulation film or the organic electronic device is present at a high temperature for a certain period of time (if present in the process), a dimensional mismatch occurs due to the difference in the degree of expansion between the substrate and the protective layer, where in the encapsulation layer between the substrate and the protective layer, some peeling, gaps or voids occur due to stress, whereby there is a situation where external oxygen or moisture is susceptible to penetration. As the present application provides an encapsulation film in which an encapsulation layer having a strain value range after application of the specific stress and a protective layer having a specific coefficient of thermal expansion are integrally included, the encapsulation layer absorbs or disperses the stress well even between the substrate and the protective layer at high temperatures to prevent the occurrence of gaps or voids on the sides of the encapsulation layer, thereby being effectively capable of preventing foreign substances from penetrating from the outside while having excellent moisture barrier properties.

In an embodiment of the present application, the encapsulation layer may comprise an encapsulation resin or a moisture adsorbent. The encapsulation resin may be a crosslinkable resin or a curable resin.

In one example, the encapsulation resin may have a glass transition temperature of less than 0° C., less than −10° C. or less than −30° C., less than −50° C. or less than −60° C. The lower limit is not particularly limited, which may be −150° C. or higher. Here, the glass transition temperature may be a glass transition temperature after curing, and in one embodiment, it may mean a glass transition temperature after irradiating it with ultraviolet rays having an irradiance level of about 1 J/cm$^2$ or more; or a glass transition temperature after the ultraviolet irradiation and then further performing thermosetting.

In one example, the encapsulation resin may comprise a styrene resin or elastomer, a polyolefin resin or elastomer, other elastomers, a polyoxyalkylene resin or elastomer, a polyester resin or elastomer, a polyvinyl chloride resin or elastomer, a polycarbonate resin or elastomer, a polyphenylene sulfide resin or elastomer, a mixture of hydrocarbons, a polyamide resin or elastomer, an acrylate resin or elastomer, an epoxy resin or elastomer, a silicone resin or elastomer, a fluorine resin or elastomer or a mixture thereof, and the like.

Here, as the styrene resin or elastomer, for example, styrene-ethylene-butadiene-styrene block copolymer (SEBS), styrene-isoprene-styrene block copolymer (SIS), acrylonitrile-butadiene-styrene block copolymer (ABS), acrylonitrile-styrene-acrylate block copolymer (ASA), styrene-butadiene-styrene block copolymer (SBS), styrene homopolymer or a mixture thereof can be exemplified. As the olefin resin or elastomer, for example, a high-density polyethylene resin or elastomer, a low-density polyethylene resin or elastomer, a polypropylene resin or elastomer or a mixture thereof can be exemplified. As the elastomer, for example, an ester thermoplastic elastomer, an olefinic elastomer, a silicone elastomer, an acrylic elastomer or a mixture thereof, and the like can be used. In particular, as the olefin thermoplastic elastomer, a polybutadiene resin or elastomer or a polyisobutylene resin or elastomer, and the like can be used. As the polyoxyalkylene resin or elastomer, for example, a polyoxymethylene resin or elastomer, a polyoxyethylene resin or elastomer or a mixture thereof, and the like can be exemplified. As the polyester resin or elastomer, for example, a polyethylene terephthalate resin or elastomer, a polybutylene terephthalate resin or elastomer or a mixture thereof, and the like can be exemplified. As the polyvinyl chloride resin or elastomer, for example, polyvinylidene chloride and the like can be exemplified. As the mixture of hydrocarbons, for example, hexatriacotane or paraffin, and the like can be exemplified. As the polyamide resin or elastomer, for example, nylon and the like can be exemplified. As the acrylate resin or elastomer, for example, polybutyl (meth)acrylate and the like can be exemplified. As the epoxy resin or elastomer, for example, bisphenol types such as bisphenol A type, bisphenol F type, bisphenol S type and a hydrogenated product thereof; novolak types such as phenol novolak type or cresol novolak type; nitrogen-containing cyclic types such as triglycidyl isocyanurate type or hydantoin type; alicyclic types; aliphatic types; aromatic types such as naphthalene type and biphenyl type; glycidyl types such as glycidyl ether type, glycidyl amine type and glycidyl ester type; dicyclo types such as dicyclopentadiene type; ester types; ether ester types or a mixture thereof, and the like can be exemplified. As the silicone resin or elastomer, for example, polydimethylsiloxane and the like can be exemplified. In addition, as the fluororesin or elastomer, a polytrifluoroethylene resin or elastomer, a polytetrafluoroethylene resin or elastomer, a polychlorotrifluoroethylene resin or elastomer, a polyhexafluoropropylene resin or elastomer, polyfluorinated vinylidene, polyfluorinated vinyl, polyfluorinated ethylene propylene or a mixture thereof, and the like can be exemplified.

The resins or elastomers listed above may be also used, for example, by being grafted with maleic anhydride or the like, by being copolymerized with other resins or elastomers through monomers for producing resins or elastomers, and by being modified with other compounds. An example of other compounds above may include carboxyl-terminal butadiene-acrylonitrile copolymers and the like.

In one example, the encapsulation layer may comprise, but is not limited to, the olefinic elastomer, the silicone elastomer or the acrylic elastomer, and the like among the above-mentioned types as the encapsulation resin.

In one embodiment of the present invention, the encapsulation resin may be an olefin-based resin. In one example, the olefin-based resin may be a homopolymer of a butylene monomer; a copolymer obtained by copolymerizing a butylene monomer and another polymerizable monomer; a reactive oligomer using a butylene monomer; or a mixture thereof. The butylene monomer may include, for example, 1-butene, 2-butene or isobutylene.

Other monomers polymerizable with the butylene monomers or derivatives may include, for example, isoprene, styrene, or butadiene and the like. By using the copolymer, physical properties such as processability and degree of cross-linking can be maintained and thus heat resistance of the adhesive itself can be secured when applied to organic electronic devices.

In addition, the reactive oligomer using the butylene monomer may comprise a butylene polymer having a reactive functional group. The oligomer may have a weight average molecular weight ranging from 500 to 5000 g/mol. Furthermore, the butylene polymer may be coupled to another polymer having a reactive functional group. The other polymer may be, but is not limited to, alkyl (meth) acrylate. The reactive functional group may be a hydroxyl group, a carboxyl group, an isocyanate group or a nitrogen-containing group. Also, the reactive oligomer and the other polymer may be cross-linked by a multifunctional cross-linking agent, and the multifunctional cross-linking agent may be at least one selected from the group consisting of an isocyanate cross-linking agent, an epoxy cross-linking agent, an aziridine cross-linking agent and a metal chelate cross-linking agent.

In one example, the encapsulation resin of the present application may comprise a copolymer of a diene and an olefinic compound containing one carbon-carbon double bond. Here, the olefinic compound may include butylene or the like, and the diene may be a monomer capable of polymerizing with the olefinic compound, and may include, for example, isoprene or butadiene and the like. For example, the copolymer of an olefinic compound containing one carbon-carbon double bond and a diene may be a butyl rubber.

In the encapsulation layer, the resin or elastomer component may have a weight average molecular weight (Mw) to an extent such that the pressure-sensitive adhesive composition can be formed into a film shape. For example, the resin or elastomer may have a weight average molecular weight of about 100,000 to 2,000,000 g/mol, 120,000 to 1,500,000 g/mol, or 150,000 to 1,000,000 g/mol or so. In this specification, the term weight average molecular weight means a value converted to standard polystyrene measured by GPC (gel permeation chromatography), and unless otherwise specified, the unit is g/mol. However, the resin or elastomer does not necessarily have the above-mentioned weight average molecular weight. For example, in the case where the molecular weight of the resin or elastomer component is not in a level enough to form a film, a separate binder resin may be blended into the pressure-sensitive adhesive composition.

In another embodiment, the encapsulation resin according to the present application may be a curable resin. When the encapsulation resin is a curable resin, the encapsulation resin may be a resin having a glass transition temperature of 85° C. or more and 200° C. or less after curing. The glass transition temperature may be a glass transition temperature after photo-curing or thermosetting the encapsulation resin. The specific kind of the usable curable resin in the present invention is not particularly limited, and for example, various thermosetting or photo-curable resins known in this field can be used. The term "thermosetting resin" means a resin that can be cured through an appropriate heat application or aging process, and the term "photo-curable resin" means a resin that can be cured by irradiation with electromagnetic waves. Furthermore, the curable resin may be a dual curing resin including both of heat curing properties and light curing properties.

The specific kind of the curable resin in the present application is not particularly limited as long as it has the above-mentioned characteristics. For example, it may be cured to exhibit an adhesive property, which may include a resin containing one or more thermosetting functional groups such as a glycidyl group, an isocyanate group, a hydroxyl group, a carboxyl group or an amide group, or containing one or more functional groups curable by irradiation with electromagnetic waves, such as an epoxide group, a cyclic ether group, a sulfide group, an acetal group or a lactone group. A specific example of such a resin may include an acrylic resin, a polyester resin, an isocyanate resin or an epoxy resin, and the like, but is not limited thereto.

In the present application, as the curable resin, aromatic or aliphatic; or linear or branched epoxy resins may be used. In one embodiment of the present invention, an epoxy resin having an epoxy equivalent of 180 g/eq to 1,000 g/eq, which contains two or more functional groups, may be used. By using the epoxy resin having an epoxy equivalent in the above range, characteristics such as adhesion performance and glass transition temperature of the cured product can be effectively maintained. An example of such an epoxy resin may include one or a mixture of two or more of a cresol novolak epoxy resin, a bisphenol A type epoxy resin, a bisphenol A type novolak epoxy resin, a phenol novolak epoxy resin, a tetrafunctional epoxy resin, a biphenyl type epoxy resin, a triphenol methane type epoxy resin, an alkyl-modified triphenol methane epoxy resin, a naphthalene type epoxy resin, a dicyclopentadiene type epoxy resin or a dicyclopentadiene-modified phenol type epoxy resin.

In the present application, as the curable resin, an epoxy resin comprising a cyclic structure in a molecular structure can be used, and an epoxy resin comprising an aromatic group (for example, a phenyl group) can be used. When the epoxy resin comprises an aromatic group, the cured product has excellent thermal and chemical stability and simultaneously exhibits a low moisture absorption amount, whereby the reliability of the organic electronic device encapsulation structure can be improved. A specific example of the aromatic group-containing epoxy resin that can be used in the present invention may be one or a mixture of two or more of a biphenyl type epoxy resin, a dicyclopentadiene type epoxy resin, a naphthalene type epoxy resin, a dicyclopentadiene-modified phenol type epoxy resin, a cresol-based epoxy resin, a bisphenol-based epoxy resin, a xylol-based epoxy resin, a multifunctional epoxy resin, a phenol novolak epoxy resin, a triphenol methane type epoxy resin, and an alkyl-modified triphenol methane epoxy resin and the like, but is not limited thereto.

In one example, the encapsulation resin may be included in an amount of 40 wt % or more, 45 wt % or more, 48 wt % or more, 50 wt % or more, 53 wt % or more, 55 wt % or more, 58 wt % or more, 60 wt % or more, or 65 wt % or more in the encapsulation layer, where the upper limit thereof may be 90 wt % or less, 85 wt % or less, 83 wt % or less, 70 wt % or less, 65 wt % or less, 60 wt % or less, or 55 wt % or less. The encapsulation resin has good moisture barrier properties, but has a disadvantage that heat resistance durability is lowered, so that by adjusting the content of the encapsulation resin, the present application may maintain the heat resistance durability at high temperature and high humidity together while sufficiently realizing the moisture barrier performance of the resin itself.

As described above, the encapsulation layer may comprise a moisture adsorbent. In this specification, the term "moisture adsorbent" may mean a chemically reactive adsorbent capable of removing moisture or humidity, for example, through chemical reaction with the moisture or humidity that has penetrated the encapsulation film, as described below.

For example, the moisture adsorbent may be present, as the form of particles, in an evenly dispersed state in the encapsulation layer or the encapsulation film. Here, the evenly dispersed state may mean a state where the moisture adsorbent is present at the same or substantially the same density even in any portion of the encapsulation layer or the encapsulation film. The moisture adsorbent that can be used in the above may include, for example, a metal oxide, a sulfate or an organometallic oxide, and the like. Specifically, an example of the sulfate may include magnesium sulfate, sodium sulfate or nickel sulfate, and the like, and an example of the organometallic oxide may include aluminum oxide octylate and the like. Here, a specific example of the metal oxide may include phosphorus pentoxide ($P_2O_5$), lithium oxide ($Li_2O$), sodium oxide ($Na_2O$), barium oxide (BaO), calcium oxide (CaO) or magnesium oxide (MgO), and the like, and an example of the metal salt may include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), a metal halogenide such as calcium chloride ($Ca\ Cl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), and the like, but is not limited thereto. As the moisture adsorbent which can be contained in the encapsulation layer, one or two or more of the above-mentioned constitutions may be also used. In one example, when two or more are used as the moisture adsorbent, calcined dolomite and the like may be used.

Such a moisture adsorbent may be controlled to an appropriate size depending on the application. In one example, the average particle diameter of the moisture adsorbent may be controlled to 100 to 15000 nm, 500 nm to 10000 nm, 800 nm to 8000 nm, 1 μm to 7 μm, 2 μm to 5 μm or 2.5 μm to 4.5 μm. The moisture adsorbent having a size in the above range is easy to store because the reaction rate with moisture is not too fast, does not damage the element to be encapsulated, and can effectively remove moisture without interfering with the hydrogen adsorption process in relation to a bright spot inhibitor to be described below. In this specification, the particle diameter may mean an average particle diameter, and may be one measured by a known method with a D50 particle size analyzer, unless otherwise specified.

The content of the moisture adsorbent is not particularly limited, which may be appropriately selected in consideration of desired barrier properties. The moisture adsorbent may be included in a range of 20 to 200 parts by weight relative to 100 parts by weight of the encapsulation resin. The lower limit of the content of the moisture adsorbent may be, for example, 25 parts by weight, 30 parts by weight, 35 parts by weight, 40 parts by weight, 45 parts by weight, 60 parts by weight, 70 parts by weight, 90 parts by weight, 100 parts by weight or 105 parts by weight or more, and the upper limit may be, for example, 190 parts by weight, 180 parts by weight, 170 parts by weight, 160 parts by weight, 155 parts by weight, 130 parts by weight, 110 parts by weight, 103 parts by weight, 98 parts by weight, 90 parts by weight or 80 parts by weight or less. In addition, as will be described below, the encapsulation layer of the present application may further comprise a bright spot inhibitor, and the weight ratio of the bright spot inhibitor to the moisture adsorbent in the encapsulation film of the present application may be in the range of 0.01 to 0.8 or 0.1 to 0.7. In the present application, the bright spot inhibitor is dispersed in the film to prevent bright spots, but the bright spot inhibitor added to prevent the bright spots may be included in a specific content ratio with the moisture adsorbent, considering implementation of moisture barrier properties and reliability of the element, which is the original function of the encapsulation film.

In one example, the encapsulation layer may further comprise a tackifier. The tackifier may be, for example, a compound with a softening point of 70° C. or higher, where in an embodiment, it may be 75° C. or higher, 78° C. or higher, 83° C. or higher, 85° C. or higher, 90° C. or higher, or 95° C. or higher, and the upper limit thereof is not particularly limited, but may be 150° C. or lower, 140° C. or lower, 130° C. or lower, 120° C. or lower, 110° C. or lower, or 100° C. or lower. The tackifier may be a compound having a cyclic structure in the molecular structure, where the number of carbon atoms in the cyclic structure may be in the range of 5 to 15. The number of carbon atoms may be, for example, in the range of 6 to 14, 7 to 13, or 8 to 12. The cyclic structure may be a monocyclic compound, but is not limited thereto, which may be a bicyclic or tricyclic compound. The tackifier may also be an olefin-based polymer, where the polymer may be a homopolymer or a copolymer. In addition, the tackifier of the present application may be a hydrogenated compound. The hydrogenated compound may be a partially or fully hydrogenated compound. Such a tackifier may have excellent moisture barrier properties and have external stress relaxation properties, while having good compatibility with other components in the encapsulation layer. A specific example of the tackifier may include a hydrogenated terpene-based resin, a hydrogenated ester-based resin or a hydrogenated dicyclopentadiene-based resin, and the like. The weight average molecular weight of the tackifier may be in the range of about 200 to 5,000 g/mol, 300 to 4,000 g/mol, 400 to 3,000 g/mol, or 500 to 2,000 g/mol. The content of the tackifier may be appropriately adjusted as necessary. For example, the content of the tackifier may be included in a ratio of 15 parts by weight to 200 parts by weight, 20 to 190 parts by weight, 25 parts by weight to 180 parts by weight or 30 parts by weight to 150 parts by weight relative to 100 parts by weight of the encapsulation resin. The present application can provide an encapsulation film having excellent moisture barrier properties and external stress relaxation properties by using the specific tackifier.

In the encapsulation film of the present application, the encapsulation layer may comprise a bright spot inhibitor. The bright spot inhibitor may have an adsorption energy of 0 eV or less for outgases, as calculated by an approximation method of the density functional theory. The lower limit of the adsorption energy is not particularly limited, but may be −20 eV. The type of the outgas is not particularly limited, but may include oxygen, H atoms, $H_2$ molecules and/or $NH_3$. As the encapsulation film comprises the bright spot inhibitor, the present application can prevent bright spots due to the outgas generated in the organic electronic device. In addition, the encapsulation layer of the present application comprises the bright spot inhibitor in the second layer located on the surface opposite to the element attachment surface of the first layer facing the organic electronic element upon encapsulation, whereby the damage to the organic electronic element according to the concentration of stress due to the bright spot inhibitor can be prevented. From such a point of view, the first layer may or may not comprise the bright spot inhibitor in 15% or less based on the mass of the entire bright spot inhibitor in the encapsulation film. In addition, the layer that does not contact the organic electronic element except for the first layer may comprise 85% or more of the bright spot inhibitor based on the mass of the entire bright spot inhibitor in the encapsulation film. That is, in the present application, upon element encapsulation, the other encapsulation layer that does not contact the organic electronic element may contain a larger amount of the bright spot inhibitor compared to the first layer facing the organic electronic element, whereby it is possible to prevent physical damage to be applied to the element, while implementing moisture barrier properties and bright spot prevention characteristics of the film.

In an embodiment of the present application, the adsorption energy between the bright spot inhibitor and the bright spot-causing atoms or molecules can be calculated through electronic structure calculation based on the density functional theory. The above calculation can be performed by a method known in the art. For example, in the present application, after making a two-dimensional slab structure in which the closest packed filling surface of a bright spot inhibitor having a crystalline structure is exposed on the surface and then performing structure optimization, and performing the structure optimization for a structure that the bright spot-causing molecules are adsorbed on the surface of this vacuum state, the value obtained by subtracting the total energy of the bright spot-causing molecules from the total energy difference of these two systems was defined as the adsorption energy. For the total energy calculation about each system, a revised-PBE function as a function of GGA (generalized gradient approximation) series was used as exchange-correlation to simulate the interaction between electrons and electrons, the used cutoff of the electron kinetic energy was 500 eV and only the gamma point corresponding to the origin of the reciprocal space was included and calculated. A conjugate gradient method was used to optimize the atomic structure of each system and iterative calculation was performed until the interatomic force was 0.01 eV/A or less. A series of calculation was performed through VASP as a commercially available code.

The material of the bright spot inhibitor is not limited as long as the material is a material having the effect of preventing the bright spots on the panel of the organic electronic device when the encapsulation film is applied to the organic electronic device. For example, the bright spot inhibitor may be a material capable of adsorbing a material exemplified by, for example, oxygen, $H_2$ gas, ammonia ($NH_3$) gas, $H^+$, $NH^{2+}$, $NHR_2$ or $NH_2R$ as outgas generated from an inorganic deposition layer of silicon oxide, silicon nitride, or silicon oxynitride deposited on an electrode of an organic electronic element. Here, R may be an organic group, and for example, may be exemplified by an alkyl group, an alkenyl group, an alkynyl group and the like, but is not limited thereto.

In one example, the material of the bright spot inhibitor is not limited as long as it satisfies the above adsorption energy value, which may be a metal or a non-metal. The bright spot inhibitor may comprise, for example, Li, Ni, Ti, Rb, Be, Mg, Ca, Sr, Ba, Al, Zn, In, Pt, Pd, Fe, Cr, Si, or a combination thereof, may comprise an oxide or a nitride of the material, and may comprise an alloy of the material. In one example, the bright spot inhibitor may comprise nickel particles, nickel oxide particles, titanium nitride, titanium-based alloy particles of iron-titanium, manganese-based alloy particles of iron-manganese, magnesium-based alloy particles of magnesium-nickel, rare earth-based alloy particles, zeolite particles, silica particles, carbon nanotubes, graphite, aluminophosphate molecular sieve particles or meso silica particles. The bright spot inhibitor may be included in an amount of 3 to 150 parts by weight, 6 to 143 parts by weight, 8 to 131 parts by weight, 9 to 123 parts by weight, 10 to 116 parts by weight, 10 parts by weight to 95 parts by weight, 10 parts by weight to 50 parts by weight, or 10 parts by weight to 35 parts by weight, relative to 100 parts by weight of the encapsulation resin. The present application can realize the bright spot prevention of the organic electronic device while improving adhesiveness and durability of the film in the above content range. In addition, the bright spot inhibitor may have a particle diameter in a range of 10 nm to 30 μm, 50 nm to 21 μm, 105 nm to 18 μm, 110 nm to 12 μm, 120 nm to 9 μm, 140 nm to 4 μm, 150 nm to 2 μm, 180 nm to 900 nm, 230 nm to 700 nm or 270 nm to 400 nm. The particle size may be according to D50 particle size analysis. By comprising the bright spot inhibitor, the present application can realize moisture barrier properties and endurance reliability of the encapsulation film together while efficiently adsorbing hydrogen generated in the organic electronic device.

Also, in the present application, as a result of analyzing the particle size of the moisture adsorbent and the bright spot inhibitor contained in the sample passed by dissolving the encapsulation layer in an organic solvent and then filtering it through a 300-mesh nylon filter, the value according to the following general formula 1 can satisfy the range of 2.4 to 3.6. That is, with regard to the following general formula 1, first, the encapsulation layer is dissolved in an organic solvent. Thereafter, the dissolved encapsulation layer composition is filtered through a 300-mesh nylon filter and the passed one is sampled. The particle size analysis is performed on the moisture adsorbent and the bright spot inhibitor included in the sampled sample. As a result of particle size analysis, D10, D50 and D90 are calculated and substituted into the following general formula 1. The lower limit of the value calculated according to the following general formula 1 may be, for example, 2.4, 2.5, 2.6, 2.7, 2.75, 2.8, 2.85, 2.9, 2.95, 3.0, 3.05, 3.1, 3.15 or 3.17 or more, and the upper limit may be, for example, 3.6, 3.5, 3.4, 3.3, 3.28, 3.25, 3.2, 3.0, 2.95, 2.9, 2.85, or 2.8 or less.

$$\sqrt{1.8 \times D60 + \frac{D60}{D10} + \frac{D90}{D50}}$$ [General Formula 1]

In General Formula 1 above, D10 is the average particle diameter according to the particle size analysis result D10, D50 is the average particle diameter according to the particle size analysis result D50, and D90 is the average particle diameter according to the particle size analysis result D90. The unit is μm. The particle size analysis may be a particle size distribution measured according to ISO13320: 2009. The definitions of D10, D50 and D90 are as defined in the particle size analysis. As a result of particle size analysis, D10, D50 and D90 may mean sizes corresponding to 10%, 50% and 90%, respectively, with respect to the maximum value in the cumulative distribution of particle sizes. Conventionally, the size of the particles included in the encapsulation layer was simply controlled through only the average particle diameter, but the present application adjusts an absolute value of D50, which is a particle diameter corresponding to the volume accumulation 50% in the cumulative distribution of particles, and an appropriate ratio between particles having a small particle size and particles having a large particle size. Through this, the present application can prevent bright spots through hydrogen adsorption while implementing moisture barrier properties, and also realize long-term endurance reliability of an organic electronic device even in a harsh environment as curing properties are not deteriorated.

In one example, the ratio of the average particle diameter according to D50 to the average particle diameter according to the particle size analysis result D10 of the moisture adsorbent and the bright spot inhibitor may be in a range of 2.0 to 4.0. The lower limit of the ratio may be, for example, 2.1, 2.2, 2.3, 2.4, 2.5, 2.6, or 2.7 or more, and the upper limit may be, for example, 4.0, 3.9, 3.8, 3.7, 3.6, 3.5, 3.4, 3.3, 3.2, 3.1, 3.0, 2.95 or 2.93.

In one embodiment, the type of the organic solvent is not particularly limited, but may be, for example, toluene, and the sample may be one measured for a sample cut into, for example, 1.5 cm×1.5 cm. In addition, in this specification, the unit mesh may be a unit of ASTM standard. When the encapsulation layer is attached to a glass substrate and/or a metal layer, the encapsulation layer may be separated from the metal layer by decapsulating it from the glass substrate and then immersing it in liquid nitrogen, where the method of decapsulating is not limited thereto, and a known method may be used. The present application may quantitatively calculate the particle diameter distribution through the particle size analysis. In addition, the filtration of the encapsulation layer through the filtering is to remove impurity particles such as dust introduced during the re-dissolution process.

In one example, the ratio of the particle diameter of the bright spot inhibitor to the particle diameter of the moisture adsorbent may be 2.0 or less. The ratio of the particle diameter may be according to the D50 particle size analysis. The lower limit of the particle diameter ratio may be 0.3, 0.5, 0.6, 0.7, 0.8, 0.9, 1.0, or 1.1 or more, and the upper limit may be 1.9, 1.8, 1.7, 1.6, 1.5, 1.4, 1.3, 1.2, 1.1, 1.0, 0.9 or less. In addition, the weight ratio of the bright spot inhibitor to the moisture adsorbent may be in a range of 0.01 to 0.8. The lower limit of the range may be, for example, 0.02, 0.03, 0.04, 0.05, 0.06, 0.08, 0.1, or 0.2 or more, and the upper limit may be, for example, 0.6, 0.4, 0.25, 0.15, or 0.09 or less. The original purpose of the encapsulation film of the present application was intended to block moisture from the outside, where in order to solve the other technical problem of hydrogen adsorption, the bright spot inhibitor was newly introduced, but there was a technical problem that it was not easy to maintain the original moisture barrier effect while comprising the bright spot inhibitor. The present application implements excellent bright spot prevention performance and desired mechanical properties while maintaining the original moisture barrier effect by adjusting the particle diameter or weight ratio relationship of the moisture adsorbent and the bright spot inhibitor.

In one example, the encapsulation layer of the present application may have a single layer or a multilayer structure comprising at least two or more encapsulation layers. In the case of comprising the two or more encapsulation layers, the encapsulation layer may comprise a first layer facing the organic electronic element when the element is encapsulated, and a second layer located on the surface opposite to the surface of the first layer facing the element. In one embodiment, the encapsulation film comprises at least two or more encapsulation layers, where the encapsulation layer may comprise the first layer facing the organic electronic element upon encapsulation and the second layer not facing the organic electronic element.

As described above, the encapsulation layer may have a multilayer structure of two or more layers. When two or more layers constitute the encapsulation layer, the compositions of the respective layers in the encapsulation layer may be the same or different. In one example, the encapsulation layer may comprise an encapsulation resin and/or a moisture adsorbent, and the encapsulation layer may be a pressure-sensitive adhesive layer or an adhesive layer.

The encapsulation layer may comprise a first layer and a second layer, where the second layer of the encapsulation layer may comprise a bright spot inhibitor. In addition, the second layer may comprise a bright spot inhibitor and a moisture adsorbent together. However, when the encapsulation film is applied on the organic electronic element, the first layer, which is the encapsulation layer facing the organic electronic element, may not comprise the bright spot inhibitor and the moisture adsorbent, or even if they are included, may comprise a small amount of 15% or less or 5% or less, on the basis of the weight of the total bright spot inhibitor and moisture adsorbent.

In addition, in one example, the encapsulation layer of the present application may comprise an active energy ray polymerizable compound which is highly compatible with the encapsulation resin and can form a specific cross-linked structure together with the encapsulation resin.

For example, the encapsulation layer of the present application may comprise a multifunctional active energy ray polymerizable compound that can be polymerized by irradiation of an active energy ray together with the encapsulation resin. The active energy ray polymerizable compound may mean a compound comprising two or more functional groups capable of participating in polymerization reaction by irradiation of an active energy ray, for example, functional groups containing an ethylenically unsaturated double bond such as an acryloyl group or a methacryloyl group, or functional groups such as an epoxy group or an oxetane group.

As the multifunctional active energy ray polymerizable compound, for example, a multifunctional acrylate (MFA) may be used.

Also, the active energy ray polymerizable compound may be included in an amount of 3 parts by weight to 30 parts by weight, 5 parts by weight to 25 parts by weight, 8 parts by weight to 20 parts by weight, 10 parts by weight to 18 parts by weight or 12 parts by weight to 18 parts by weight, relative to 100 parts by weight of the encapsulation resin. The present application provides an encapsulation film having excellent endurance reliability even under severe conditions such as high temperature and high humidity in the above range.

The multifunctional active energy ray polymerizable compound which can be polymerized by irradiation of the active energy ray can be used without any limitation. For example, the compound may include 1,4-butanediol di(meth)acrylate, 1,3-butylene glycol di(meth)acrylate, 1,6-hexanediol di(meth)acrylate (HDDA), 1,8-octanediol di(meth)acrylate, 1,12-dodecanediol di(meth)acrylate, neopentylglycol di(meth)acrylate, dicyclopentanyl di(meth) acrylate, cyclohexane-1,4-diol di(meth)acrylate, tricyclodecanedimethanol (meth)diacrylate, dimethyloldicyclopentane di(meth)acrylate, neopentylglycol-modified trimethylol propane di(meth)acrylate, admantane di(meth)acrylate, trimethylolpropane tri(meth)acrylate (TMPTA), or a mixture thereof.

As the multifunctional active energy ray polymerizable compound, for example, a compound having a molecular weight of 100 or more and less than 1,000 g/mol and containing two or more functional groups may be used. The ring structure included in the multifunctional active energy ray polymerizable compound may be any one of a carbocyclic structure or a heterocyclic structure; or a monocyclic or polycyclic structure.

In an embodiment of the present application, the encapsulation layer may further comprise a radical initiator. The radical initiator may be a photoinitiator or a thermal initiator. The specific kind of the photoinitiator can be appropriately selected in consideration of curing rate and yellowing possibility, and the like. For example, benzoin-based, hydroxy ketone-based, amino ketone-based or phosphine oxide-based photoinitiators, and the like can be used, and specifically, benzoin, benzoin methyl ether, benzoin ethyl ether, benzoin isopropyl ether, benzoin n-butyl ether, benzoin isobutyl ether, acetophenone, dimethylamino acetophenone, 2,2-dimethoxy-2-phenylacetophenone, 2,2-diethoxy-2-phenylacetophenone, 2-hydroxy methyl-1-phenylpropan-1-one, 1-hydroxycyclohexylphenyl ketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, p-dimethylaminobenzoic acid ester, oligo[2-hydroxy-2-methyl-1-[4-(1-methylvinyl)phenyl]propanone] and 2,4,6-trimethylbenzoyl-diphenyl-phosphine oxide, and the like can be used.

The radical initiator may be included in a ratio of 0.2 parts by weight to 20 parts by weight, 0.5 to 18 parts by weight, 1 to 15 parts by weight, or 2 parts by weight to 13 parts by weight, relative to 100 parts by weight of the active energy ray polymerizable compound. As a result, the reaction of the active energy ray polymerizable compound can be effectively induced and deterioration of the physical properties of the encapsulation layer composition due to the residual components after curing can be also prevented.

In an embodiment of the present application, the encapsulation layer of the encapsulation film may further comprise a curing agent, depending on the type of the included resin component. For example, it may further comprise a curing agent capable of reacting with the above-mentioned encapsulation resin to form a cross-linked structure or the like. In this specification, the terms encapsulation resin and/or binder resin may be used in the same sense as the resin component.

The kind of the curing agent may be appropriately selected and used depending on the type of the resin component or the functional group contained in the resin.

In one example, when the resin component is an epoxy resin, the curing agent is a curing agent of the epoxy resin known in the art, and for example, one or two or more of an amine curing agent, an imidazole curing agent, a phenol curing agent, a phosphorus curing agent or an acid anhydride curing agent, and the like can be used, without being limited thereto.

In one example, as the curing agent, an imidazole compound which is solid at room temperature and has a melting point or a decomposition temperature of 80° C. or higher can be used. As such a compound, for example, 2-methylimidazole, 2-heptadecylimidazole, 2-phenylimidazole, 2-phenyl-4-methylimidazole or 1-cyanoethyl-2-phenylimidazole, and the like may be exemplified, but is not limited thereto.

The content of the curing agent may be selected depending on composition of the composition, for example, the type or ratio of the encapsulation resin. For example, the curing agent may be contained in an amount of 1 part by weight to 20 parts by weight, 1 part by weight to 10 parts by weight or 1 part by weight to 5 parts by weight, relative to 100 parts by weight of the resin component. However, the weight ratio can be changed depending on the type and ratio of the encapsulation resin or the functional group of the resin, or the cross-linking density to be implemented, and the like.

When the resin component is a resin which can be cured by irradiation of the active energy ray, for example, a cationic photopolymerization initiator may be used as the initiator.

As the cationic photopolymerization initiator, ionized cationic initiators of onium salt organometallic salt series, or nonionized cationic photopolymerization initiators of organic silane or latent sulfonic acid series can be used. As the initiator of the onium salt series, diaryliodonium salt, triarylsulfonium salt or aryldiazonium salt, and the like can be exemplified, as the initiator of the organometallic salt series, iron arene and the like can be exemplified, as the initiator of the organosilane series, o-nitrobenzyl triaryl silyl ether, triaryl silyl peroxide or acyl silane, and the like can be exemplified, and as the initiator of the latent sulfuric acid series, α-sulfonyloxy ketone or α-hydroxymethylbenzoin sulfonate, and the like can be exemplified, without being limited thereto.

In one example, as the cationic initiator, an ionized cationic photopolymerization initiator may be used.

The encapsulation layer may also comprise a moisture blocker, if desired. In this specification, the term "moisture blocker" may mean a material which has free or low reactivity with moisture, but can physically block or hinder movement of moisture or humidity within the film. As the moisture blocker, for example, one or two or more of clay, talc, needle-like silica, plate-like silica, porous silica, zeolite, titania or zirconia can be used. In addition, the moisture blocker can be surface-treated with an organic modifier or the like to facilitate penetration of organic substances. As such an organic modifier, for example, dimethyl benzyl hydrogenated tallow quaternary ammonium, dimethyl hydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium or a mixture thereof, and the like can be used.

The content of the moisture blocker is not particularly limited and may be suitably selected in consideration of the desired blocking characteristics.

In addition to the above-described constitutions, the encapsulation layer may comprise various additives depending on applications and the manufacturing process of the encapsulation film to be described below. For example, the encapsulation layer may comprise a curable material, a cross-linking agent, a filler or the like in an appropriate range of content depending on the intended physical properties.

When the encapsulation layer is formed of two or more layers, the second layer that does not contact the organic electronic element may comprise the moisture adsorbent. For example, when it is formed of two or more layers, the layer in contact with the organic electronic element among the encapsulation layer may comprise no moisture adsorbent, or comprise the moisture adsorbent in a small amount of less than 5 parts by weight or less than 4 parts by weight relative to 100 parts by weight of the encapsulation resin.

Specifically, considering that the encapsulation film is applied to encapsulation of an organic electronic element, the content of the moisture adsorbent can be controlled in consideration of the damage of the element. For example, the first layer facing the element upon encapsulation may be comprised of a small amount of a moisture adsorbent, or comprise no moisture adsorbent. In one example, the first layer of the encapsulation layer facing the element upon encapsulation may comprise 0 to 20% of a moisture adsorbent relative to the total mass of the moisture adsorbent contained in the encapsulation film. In addition, the encapsulation layer that does not contact the element may comprise 80 to 100% of a moisture adsorbent relative to the total mass of the moisture adsorbent contained in the encapsulation film.

In an embodiment of the present application, the protective layer may be a metal layer. The metal layer of the present application may have thermal conductivity of 20 W/m K or more, 50 W/m K or more, 60 W/m K or more, 70 W/m K or more, 80 W/m K or more, 90 W/m K or more, 100 W/m K or more, 110 W/m·K or more, 120 W/m·K or more, 130 W/m·K or more, 140 W/m·K or more, 150 W/m·K or more, 200 W/m·K or more, or 210 W/m·K or more. The upper limit of the thermal conductivity is not particularly limited, which may be 800 W/m·K or less. By having such high thermal conductivity, the heat generated at the bonding interface upon the metal layer bonding process can be released more quickly. Also, the heat accumulated during the operation of the organic electronic device is rapidly released because of the high thermal conductivity, whereby the temperature of the organic electronic device itself can be kept lower, and the occurrence of cracks and defects is reduced. The thermal conductivity may be measured at any temperature in the temperature range of 15 to 30° C.

The term "thermal conductivity" herein is a degree representing capability in which a material is capable of transferring heat by conduction, where the unit may be expressed by W/m·K. The unit represents the degree to which the material transfers heat at the same temperature and distance, which means a unit of heat (watt) to a unit of distance (meter) and a unit of temperature (Kelvin).

In an embodiment of the present application, the protective layer of the encapsulation film may be transparent or opaque. The protective layer may have a thickness in a range of 3 μm to 200 μm, 10 μm to 100 μm, 20 μm to 90 μm, 30 μm to 85 μm, 40 μm to 75 μm, or 65 μm to 73 μm. The protective layer may be in a single layer or in the laminated form of two or more protective layers. The present application can provide a thin film encapsulation film while realizing sufficient heat release effect by controlling the thickness of the protective layer. The protective layer may be a thin metal foil or a polymer base layer deposited with metal. The protective layer is not particularly limited as long as it is a material satisfying the above-described thermal conductivity and containing a metal. The protective layer may comprise any one from a metal, a metal oxide, a metal nitride, a metal carbide, a metal oxynitride, a metal oxyboride, and a combination thereof. For example, the metal layer may comprise an alloy in which one or more metal elements or nonmetal elements are added to one metal, and may comprise, for example, stainless steel (SUS). In addition, in one example, the metal layer may comprise iron, chromium, copper, aluminum, nickel, iron oxide, chromium oxide, silicon oxide, aluminum oxide, titanium oxide, indium oxide, tin oxide, indium tin oxide, tantalum oxide, zirconium oxide, niobium oxide and a combination thereof. The metal layer may be deposited by means of electrolysis, rolling, thermal evaporation, electron beam evaporation, sputtering, reactive sputtering, chemical vapor deposition, plasma chemical vapor deposition or electron cyclotron resonance source plasma chemical vapor deposition. In one example of the present application, the metal layer may be deposited by reactive sputtering.

Conventionally, a nickel-iron alloy (invar) was usually used as a metal layer of an encapsulation film, but the nickel-iron alloy has a disadvantage that its price is high, its thermal conductivity is low, and its cutting property is poor. The present application provides an encapsulation film that prevents generation of bright spots of organic electronic devices, has excellent heat release characteristics, and implements process convenience due to magnetism, without using the nickel-iron alloy as the metal layer.

In one example, the protective layer may have a coefficient of thermal expansion measured according to ASTM E831 standard in a range of 6 to 30 ppm/° C. or 8 to 20 ppm/° C. The coefficient of thermal expansion according to this specification may be measured according to the above standard. In addition, as will be described below, in the encapsulation film of the present application, the encapsulation layer may encapsulate the top surface of the organic electronic element on the substrate. The substrate may have a coefficient of thermal expansion in the range of less than 8 ppm/° C., 1 to 7 ppm/° C., or 2 to 4.5 ppm/° C. When the encapsulation film encapsulates an organic electronic element, a substrate, an organic electronic element, an encapsulation layer for encapsulating the organic electronic element and a protective layer on the encapsulation layer are laminated in this order. In this case, thermal expansion properties between the substrate and the protective layer may be different. The ratio of the coefficient of thermal expansion of the glass substrate to the coefficient of thermal expansion of the protective layer may be in a range of 0.01 to 0.7. The lower limit of the ratio may be, for example, 0.05, 0.1, 0.15, 0.2, 0.25, or 0.3 or more, and the upper limit may be, for example, 0.65, 0.6, 0.55, 0.5, 0.45, 0.43, 0.4, or 0.35 or less.

In one example, the encapsulation layer according to the present application may have an elastic portion (Ep) value in a range of 20 to 50%, 23 to 45%, or 26 to 40%. With regard to the elastic portion (Ep), first, after laminating the encapsulation layer to a thickness of 750 to 850 μm to prepare a film sample, a normal force of about 150 gf is applied at 85° C. using a parallel plate by means of ARES (Advanced Rheometric Expansion System, TA's ARES-G2) in the stress relaxation (relaxation test) mode to apply a strain of 50% to the film sample, and then the maximum stress value 94 measured after 1 second is measured. The stress value measurement is performed at 1 second intervals. After maintaining the state where the strain is applied to the film sample for 180 seconds, the stress value σ2 measured at 180 seconds is additionally measured and the elastic portion (Ep) according to the following general formula 2 is calculated.

$$Ep\ (\text{unit: }\%) = 100 \times \sigma 2/\sigma 1 \quad \text{[General Formula 2]}$$

In the above measurement, it must be noted that there are no air bubbles when loading the pressure-sensitive adhesive film between the flat plates. The present application may provide an encapsulation film having desired physical properties within the above Ep range.

In one example, the ratio of bending stiffness (Dtot) to horizontal direction thermal resistance (Rtot) in the encapsulation film may be $1.3\times10^{-5}$ Pa·m$^3$·W/K or more. The lower limit of the ratio may be, for example, $1.5\times10^{-5}$ Pa·m$^3$·W/K, $1.8\times10^{-5}$ Pa·m$^3$·W/K, $2.0\times10^{-5}$ Pa·m$^3$·W/K, $2.3\times10^{-5}$ Pa·m$^3$·W/K, $2.5\times10^{-5}$ Pa·m$^3$·W/K, $2.8\times10^{-5}$ Pa·m$^3$·W/K, $3.0\times10^{-5}$ Pa·m$^3$·W/K, $3.3\times10^{-5}$ Pa·m$^3$·W/K, $3.8\times10^{-5}$ Pa·m$^3$·W/K, $4.2\times10^{-5}$ Pa·m$^3$·W/K, $4.8\times10^{-5}$ Pa·m$^3$·W/K, $5.0\times10^{-5}$ Pa·m$^3$·W/K or $1.0\times10^{-4}$ Pa·m$^3$·W/K or more, and the upper limit may also be, for example, $9.0\times10^{-4}$ Pa·m$^3$·W/K, $6.0\times10^{-4}$ Pa·m$^3$·W/K, $5.0\times10^{-4}$ Pa·m$^3$·W/K, $2.0\times10^{-4}$ Pa·m$^3$·W/K, $2.0\times10^{-5}$ Pa·m$^3$·W/K or $1.7\times10^{-5}$ Pa·m$^3$·W/K or less. In this specification, the horizontal direction thermal resistance may be measured according to ISO 22007-2. The horizontal direction thermal resistance may be measured in the direction in which the metal layer is present in the encapsulation film with a multilayer structure, and may be measured for a unit horizontal area (1 m×1 m). After measuring the thermal conductivity, the horizontal direction thermal resistance may be calculated according to ISO 22007-2, using the formation information (for example, thickness) of the film, which may be calculated by a method known in the art. The horizontal direction thermal resistance defined herein is the reciprocal of the thermal conductance and the unit is K (Kelvin)/W (Watt) or ° C./W. The thermal conductance means a ratio of the heat quantity flowing through an object per unit area and unit time and the temperature difference between both surfaces of the object, that is, a value obtained by dividing the thermal conductivity by the heat transfer direction length.

The horizontal direction thermal resistance (Rtot) of the encapsulation film may be 25K/W or more. The lower limit of the horizontal direction thermal resistance (Rtot) may be, for example, 25 K/W, 28 K/W, 30 K/W, 35 K/W, 40 K/W, 45 K/W, 50 K/W, 55 K/W, 80 K/W, 100 K/W, 150 K/W, 200 K/W, 300 K/W, or 500 K/W or more, and the upper limit may be, for example, 1000 K/W, 900 K/W, 850 K/W, 600 K/W, 400 K/W, 250 K/W, 180 K/W, 130 K/W, 110 K/W, or 80 K/W or less. In addition, the bending stiffness (Dtot) of the encapsulation film may be in the range of 0.001 Pa·m$^3$ to 1 Pa·m$^3$. The lower limit of the bending stiffness may be, for example, 0.0015 Pa·m$^3$, 0.005 Pa·m$^3$, 0.01 Pa·m$^3$, 0.012 Pa·m$^3$, 0.015 Pa·m$^3$, 0.02 Pa·m$^3$, 0.04 Pa·m$^3$, or 0.06 Pa·m$^3$ or more, and the upper limit may be, for example, 1 Pa·m$^3$, 0.1 Pa·m$^3$, 0.09 Pa·m$^3$, 0.08 Pa·m$^3$, 0.07 Pa·m$^3$, 0.065 Pa·m$^3$, 0.05 Pa·m$^3$, 0.03 Pa·m$^3$, 0.02 Pa·m$^3$, 0.018 Pa·m$^3$, or 0.015 Pa·m$^3$ or less.

By controlling the above ratio in the multi-layered encapsulation film structure, the present application can suppress panel warpage in high-temperature processes to prevent peeling between the layers while maintaining the overall heat dissipation performance excellently, and implement moisture barrier properties and dimensional stability, and high-temperature endurance reliability together.

The horizontal direction thermal resistance (Rtot) and bending stiffness (Dtot) may be measured in the following manner.

FIG. 3 shows a cross-sectional diagram of an encapsulation film, where y=0 is the thickness center of the entire encapsulation film structure.

$$D_{tot} = \frac{1}{3}\sum_{k=1}^{n} E_k\left(a_k^3 - a_{k-1}^3\right) \quad \text{(General Formula 3)}$$

$$\frac{1}{R_{tot}} = \sum_{k=1}^{n} \frac{1}{k_k(a_k - a_{k-1})}$$

Here, $a_k$ is the distance from the thickness center of the entire encapsulation film structure to the upper surface of each layer, $E_k$ is the elastic modulus of each layer, and $k_k$ is the thermal conductivity of each layer. When the entire encapsulation film structure has been laminated in the order of the metal layer and the encapsulation layer, the metal layer may be defined as the upper surface. In addition, even when the encapsulation layer is multi-layered (the first layer and the second layer), the encapsulation layer may be counted as one layer. The thermal conductivity may be measured using a hot disc method (TPS2200) according to the procedure specified in ISO 22007-2. In the case of the encapsulation layer, the thermal conductivity may be measured after laminating the prepared encapsulation layer to produce a 1 mm thick sample.

In the case of the metal layer, specimen production and tensile testing have been performed according to the procedure of ASTM E8/E8M, and the elastic modulus can be derived through the slope in the elastic section in the stress-strain curve (measured at a temperature of 25° C. and a tension rate of 1-10 mm/min, and in an elastic section within a strain of 1%). In the case of the encapsulation layer, the prepared encapsulation layer is laminated to produce a 1 mm thick sample, and then specimen production and tensile testing can be performed according to ASTM D638 procedure. In the present application, as the D value increases, bending resistance is increased, whereby bending is suppressed, and as R decreases, heat transfer in a horizontal direction is easy, whereby heat dissipation performance can be realized. Accordingly, the present application can implement desired physical properties through the above ratio.

An exemplary encapsulation film may further comprise a base film or a release film (hereinafter, may be referred to as a “first film”), which may have a structure in which the encapsulation layer is formed on the base or release film. Also, the structure may further comprise a base film, a protective film or a release film (hereinafter, may be referred to as a “second film”) formed on the metal layer.

The specific kind of the first film that can be used in the present application is not particularly limited. In the present application, for example, a general polymer film in this field can be used as the first film. In the present application, for example, as the base or release film, a polyethylene terephthalate film, a polytetrafluoroethylene film, a polyethylene film, a polypropylene film, a polybutene film, a polybutadiene film, a polyvinyl chloride film, a polyurethane film, an ethylene-vinyl acetate film, an ethylene-propylene copolymer film, an ethylene-ethyl acrylate copolymer film, an ethylene-methyl acrylate copolymer film or a polyimide film, and the like can be used. In addition, a suitable mold release treatment may be performed on one side or both sides of the base film or release film of the present application. As an example of the releasing agent used in the releasing treatment of the base film, alkyd series, silicone series, fluorine series, unsaturated ester series, polyolefin series or wax series, and the like can be used, and among them, a releasing agent of alkyd series, silicone series or fluorine series is preferably used in terms of heat resistance, without being limited thereto.

In the present application, the thickness of the base film or release film (first film) as above is not particularly limited, which may be appropriately selected depending on the application to which it is applied. For example, in the present application, the thickness of the first film may be 10 μm to 500 μm, preferably, 20 μm to 200 μm or so. If the thickness is less than 10 μm, deformation of the base film may easily occur during the manufacturing process, whereas if it exceeds 500 μm, the economic efficiency is low.

The thickness of the encapsulation layer included in the encapsulation film of the present application is not particularly limited, which may be appropriately selected in accordance with the following conditions in consideration of the application to which the film is applied. The thickness of the encapsulation layer may be 5 μm to 200 μm, preferably, 5 μm to 100 μm or so. The thickness of the encapsulation layer may be the entire thickness of the multi-layered encapsulation layer. If the thickness of the encapsulation layer is less than 5 μm, sufficient moisture barrier ability cannot be exhibited, whereas if it exceeds 200 μm, it is difficult to secure processability, the thickness expansion due to moisture reactivity is large, so that the deposited film of the organic light emitting element may be damaged, and the economic efficiency is low.

The present application also relates to an organic electronic device. As shown in FIG. 2, the organic electronic device may comprise a substrate (31); an organic electronic element (32) formed on the substrate (31); and the above-described encapsulation film (33, 34) for encapsulating the organic electronic element (32). The encapsulation film may encapsulate the top surface, for example, all the upper part and the side surface, of the organic electronic element formed on the substrate. The encapsulation film may comprise an encapsulation layer containing a pressure-sensitive adhesive composition or an adhesive composition in a cross-linked or cured state. Furthermore, the organic electronic device may be formed by sealing the encapsulation layer so as to contact the top surface of the organic electronic element formed on the substrate.

In an embodiment of the present application, the organic electronic element may comprise a pair of electrodes, an organic layer containing at least a light emitting layer, and a passivation film. Specifically, the organic electronic element may comprise a first electrode layer, an organic layer formed on the first electrode layer and containing at least a light emitting layer, and a second electrode layer formed on the organic layer, and may comprise a passivation film for protecting the electrode on the second electrode layer and the organic layer. The first electrode layer may be a transparent electrode layer or a reflective electrode layer, and the second electrode layer may also be a transparent electrode layer or a reflective electrode layer. More specifically, the organic electronic element may comprise a transparent electrode layer formed on a substrate, an organic layer formed on the transparent electrode layer and containing at least a light emitting layer, and a reflective electrode layer formed on the organic layer.

Here, the organic electronic element may be, for example, an organic light emitting element.

The passivation film may comprise an inorganic film and an organic film. In one embodiment, the inorganic film may be metal oxides or nitrides of one or more selected from the group consisting of Al, Zr, Ti, Hf, Ta, In, Sn, Zn and Si. The inorganic film may have a thickness of 0.01 μm to 50 μm or 0.1 μm to 20 μm or 1 μm to 10 μm. In one example, the inorganic film of the present application may be an inorganic material containing no dopant, or may be an inorganic material containing a dopant. The dopant which can be doped may be one or more elements selected from the group consisting of Ga, Si, Ge, Al, Sn, Ge, B, In, Tl, Sc, V, Cr, Mn, Fe, Co and Ni, or an oxide of the element, but is not limited thereto. The organic film is distinguished from the organic layer containing at least a light emitting layer in that it does not include a light emitting layer, and may be an organic deposition layer containing an epoxy compound.

The inorganic film or the organic film may be formed by chemical vapor deposition (CVD). For example, as the inorganic film, silicon nitride (SiNx) may be used. In one example, silicon nitride (SiNx) used as the inorganic film may be deposited to a thickness of 0.01 μm to 50 μm. In one example, the organic film may have a thickness in a range of 2 μm to 20 μm, 2.5 μm to 15 μm, or 2.8 μm to 9 μm.

The present application also provides a method for manufacturing an organic electronic device. The manufacturing method may comprise a step of applying the above-described encapsulation film to a substrate, on which an organic electronic element is formed, so as to cover the organic electronic element. In addition, the manufacturing method may comprise a step of curing the encapsulation film. The curing step of the encapsulation film may mean curing of the encapsulation layer, which may proceed before or after the encapsulation film covers the organic electronic element.

In this specification, the term "curing" may mean that the pressure-sensitive adhesive composition of the present invention forms a cross-linked structure through heating or UV irradiation processes, and the like to be produced in the form of a pressure-sensitive adhesive. Alternatively, it may mean that the adhesive composition is solidified and attached as an adhesive.

Specifically, the organic electronic element may be formed by forming a transparent electrode on a glass or polymer film used as a substrate by a method such as vacuum evaporation or sputtering, forming a luminescent organic material layer composed of, for example, a hole transporting layer, a light emitting layer and an electron transporting layer, and the like on the transparent electrode, and then further forming an electrode layer thereon. Subsequently, the encapsulation layer of the encapsulation film is placed to cover the top surface of the organic electronic element of the substrate subjected to the above process.

The encapsulation film of the present application can be applied to sealing or encapsulation of organic electronic devices such as OLEDs. The film provides an encapsulation film having excellent reliability that allows forming a structure capable of blocking moisture or oxygen flowing into an organic electronic device from the outside, and absorbs and disperses the stress caused by panel bending, while preventing generation of bright spots in the organic electronic device.

EXPLANATION OF REFERENCE NUMERALS

Figure 1:
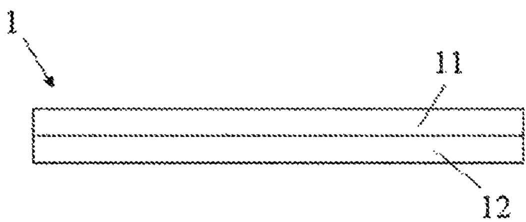
FIG. 1 is a cross-sectional diagram illustrating an encapsulation film according to an embodiment of the present disclosure.
Figure 2:
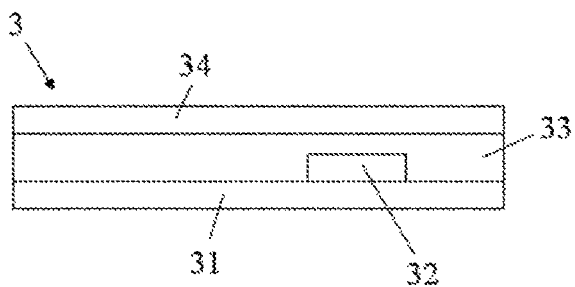
FIG. 2 is a cross-sectional diagram illustrating an organic electronic device according to an embodiment of the present disclosure.

1: encapsulation film
11: protective layer
12: encapsulation layer
3: organic electronic device
31: substrate
32: organic electronic element
33: encapsulation layer
34: protective layer
41: encapsulation film
42: glass substrate

DETAILED DESCRIPTION

Hereinafter, the present invention will be described in more detail through examples according to the present invention and comparative examples not according to the present invention, but the scope of the present invention is not limited by the following examples.

Example 1

Preparation of Encapsulation Layer

To prepare a first layer solution, a solution (solid content 33%) in which a butyl rubber resin (BR068, EXXON) and a tackifier (hydrogenated dicyclopentadiene resin with 9 carbon atoms, softening point: 90° C., Mw: 570 g/mol) were diluted at a weight ratio (parts by weight) of 50:45 with toluene was prepared, and then the solution was homogenized. 5 parts by weight of a multifunctional acrylate (HDDA, Miwon) and 1 part by weight of a photoinitiator (Irgacure819, BASF) were introduced to the homogenized solution and homogenized, and then stirred at high speed for 1 hour to prepare a first layer solution.

To prepare a second layer solution, CaO (Sigma-Aldrich, average particle diameter 1 μm) as a moisture adsorbent was prepared as a solution (solid content 50%). In addition, separately from this, a solution (solid content 50%) in which a butyl rubber resin (BR068, EXXON), Ni particles (particle diameter about 300 nm) as a bright spot inhibitor and a tackifier (hydrogenated dicyclopentadiene resin with 9 carbon atoms, softening point: 90° C., Mw: 570 g/mol) were diluted at a weight ratio (parts by weight) of 40:10:55 (butyl rubber:Ni:tackifier) with toluene, respectively, was prepared, and then the solution was homogenized. 5 parts by weight of a multifunctional acrylate (HDDA, Miwon) and 1 part by weight of a photoinitiator (Irgacure819, BASF) were introduced to the homogenized solution and homogenized, and then the moisture adsorbent solution was introduced thereto so that the amount of the moisture adsorbent was 60 parts by weight, and then stirred at high speed for 1 hour to prepare a second layer solution.

The encapsulation layer solution as prepared above was separately applied to the release surface of the release PET using a comma coater for the first layer (thickness 10 μm) and the second layer (thickness 50 μm), respectively, dried in a dryer at 130° C. for 3 minutes to form encapsulation layers with the total thickness of 60 μm, and then two layers were laminated.

Production of Encapsulation Film

On the metal layer (SUS430, thickness 70 μm) prepared in advance, the release-treated PET attached to the second layer of the encapsulation layer was peeled off and laminated at 70° C. by a roll-to-roll process, whereby an encapsulation film was produced so that the second layer was in contact with the metal layer.

The produced encapsulation film was cut to produce a film for encapsulating an organic electronic element. The physical properties of the sample obtained by irradiating the produced film with ultraviolet rays at 2 J/cm$^2$ are measured.

Example 2

An encapsulation film was produced in the same manner as in Example 1, except that the encapsulation layer was formed as a single layer of the second layer without preparing the first layer, and the contents of the butyl rubber, tackifier, HDDA, moisture adsorbent, bright spot inhibitor and photoinitiator included in the second layer were changed to a weight ratio (parts by weight) of 55:40:5:60:10:1.

Example 3

Preparation of Encapsulation Layer

To prepare a first layer solution, a solution (solid content 33%) in which a butyl rubber resin (BR068, EXXON) and a tackifier (hydrogenated dicyclopentadiene resin with 9 carbon atoms, softening point: 90° C., Mw: 570 g/mol) were diluted at a weight ratio (parts by weight) of 80:15 with toluene was prepared, and then the solution was homogenized. 5 parts by weight of a multifunctional acrylate (TMPTA, Miwon) and 1 part by weight of a photoinitiator (Irgacure819, BASF) were introduced to the homogenized solution and homogenized, and then stirred at high speed for 1 hour to prepare a first layer solution.

To prepare a second layer solution, CaO (Sigma-Aldrich, average particle diameter 1 μm) as a moisture adsorbent was prepared as a solution (solid content 50%). In addition, separately from this, a solution (solid content 50%) in which a butyl rubber resin (BR068, EXXON), Ni particles (particle diameter about 300 nm) as a bright spot inhibitor and a tackifier (hydrogenated dicyclopentadiene resin with 9 carbon atoms, softening point: 90° C., Mw: 570 g/mol) were diluted at a weight ratio (parts by weight) of 65:10:30 (butyl rubber:Ni:tackifier) with toluene, respectively, was prepared, and then the solution was homogenized. 5 parts by weight of a multifunctional acrylate (TMPTA, Miwon) and 1 part by weight of a photoinitiator (Irgacure819, BASF) were introduced to the homogenized solution and homogenized, and then the moisture adsorbent solution was introduced thereto so that the amount of the moisture adsorbent was 60 parts by weight, and then stirred at high speed for 1 hour to prepare a second layer solution.

The encapsulation layer solution as prepared above was separately applied to the release surface of the release PET using a comma coater for the first layer and the second layer, respectively, dried in a dryer at 130° C. for 3 minutes to form encapsulation layers with thicknesses of 50 μm, respectively, and then two layers were laminated.

Production of Encapsulation Film

On the metal layer (Al, thickness 70 μm) prepared in advance, the release-treated PET attached to the second layer of the encapsulation layer was peeled off and laminated at 70° C. by a roll-to-roll process, whereby an encapsulation film was produced so that the second layer was in contact with the metal layer.

The produced encapsulation film was cut to produce a film for encapsulating an organic electronic element. The physical properties of the sample obtained by irradiating the produced film with ultraviolet rays at 2 J/cm$^2$ are measured.

Example 4

Preparation of Encapsulation Layer

To prepare a first layer solution, a solution (solid content 33%) in which a butyl rubber resin (BR068, EXXON) and a tackifier (hydrogenated dicyclopentadiene resin with 9 carbon atoms, softening point: 90° C., Mw: 570 g/mol) were diluted at a weight ratio (parts by weight) of 40:55 with toluene was prepared, and then the solution was homogenized. 5 parts by weight of a multifunctional acrylate (TMPTA, Miwon) and 1 part by weight of a photoinitiator (Irgacure819, BASF) were introduced to the homogenized solution and homogenized, and then stirred at high speed for 1 hour to prepare a first layer solution.

To prepare a second layer solution, CaO (Sigma-Aldrich, average particle diameter 1 μm) as a moisture adsorbent was prepared as a solution (solid content 50%). In addition, separately from this, a solution (solid content 50%) in which a butyl rubber resin (BR068, EXXON), Ni particles (particle diameter about 300 nm) as a bright spot inhibitor and a tackifier (hydrogenated dicyclopentadiene resin with 9 carbon atoms, softening point: 90° C., Mw: 570 g/mol) were diluted at a weight ratio (parts by weight) of 40:10:55 (butyl rubber:Ni:tackifier) with toluene, respectively, was prepared, and then the solution was homogenized. 5 parts by weight of a multifunctional acrylate (TMPTA, Miwon) and 1 part by weight of a photoinitiator (Irgacure819, BASF) were introduced to the homogenized solution and homogenized, and then the moisture adsorbent solution was introduced thereto so that the amount of the moisture adsorbent was 60 parts by weight, and then stirred at high speed for 1 hour to prepare a second layer solution.

The encapsulation layer solution as prepared above was separately applied to the release surface of the release PET using a comma coater for the first layer and the second layer, respectively, dried in a dryer at 130° C. for 3 minutes to form encapsulation layers with thicknesses of 50 μm, respectively, and then two layers were laminated.

Production of Encapsulation Film

On the metal layer (Al, thickness 70 μm) prepared in advance, the release-treated PET attached to the second layer of the encapsulation layer was peeled off and laminated at 70° C. by a roll-to-roll process, whereby an encapsulation film was produced so that the second layer was in contact with the metal layer.

The produced encapsulation film was cut to produce a film for encapsulating an organic electronic element. The physical properties of the sample obtained by irradiating the produced film with ultraviolet rays at 2 J/cm$^2$ are measured.

Example 5

An encapsulation film was prepared in the same manner as in Example 1, except that the metal layer was changed to aluminum having a thickness of 80 μm instead of SUS430.

Example 6

An encapsulation film was prepared in the same manner as in Example 1, except that the metal layer was changed to two layers of SUS having a thickness of 40 μm and aluminum having a thickness of 40 μm instead of SUS430.

Comparative Example 1

Preparation of Encapsulation Layer

To prepare a first layer solution, a solution (solid content 33%) in which a polyisobutylene resin (PIB, B50, BASF) and a tackifier (hydrogenated dicyclopentadiene resin with 9 carbon atoms, softening point: 90° C., Mw: 570 g/mol) were diluted at a weight ratio (parts by weight) of 50:45 with toluene was prepared, and then the solution was homogenized. 5 parts by weight of a multifunctional acrylate (HDDA, Miwon) and 1 part by weight of a photoinitiator (Irgacure819, BASF) were introduced to the homogenized solution and homogenized, and then stirred at high speed for 1 hour to prepare a first layer solution.

To prepare a second layer solution, CaO (Sigma-Aldrich, average particle diameter 1 μm) as a moisture adsorbent was prepared as a solution (solid content 50%). In addition, separately from this, a solution (solid content 50%) in which a polyisobutylene resin (PIB), Ni particles (particle diameter about 300 nm) as a bright spot inhibitor and a tackifier (hydrogenated dicyclopentadiene resin with 9 carbon atoms, softening point: 90° C., Mw: 570 g/mol) were diluted at a weight ratio (parts by weight) of 40:10:55 (PIB:Ni:tackifier) with toluene, respectively, was prepared, and then the solution was homogenized. 5 parts by weight of a multifunctional acrylate (HDDA, Miwon) and 1 part by weight of a photoinitiator (Irgacure819, BASF) were introduced to the homogenized solution and homogenized, and then the moisture adsorbent solution was introduced thereto so that the amount of the moisture adsorbent was 60 parts by weight, and then stirred at high speed for 1 hour to prepare a second layer solution.

The encapsulation layer solution as prepared above was separately applied to the release surface of the release PET using a comma coater for the first layer and the second layer, respectively, dried in a dryer at 130° C. for 3 minutes to form encapsulation layers with thicknesses of 50 μm, respectively, and then two layers were laminated.

Production of Encapsulation Film

On the metal layer (SUS430, thickness 70 μm) prepared in advance, the release-treated PET attached to the second layer of the encapsulation layer was peeled off and laminated at 70° C. by a roll-to-roll process, whereby an encapsulation film was produced so that the second layer was in contact with the metal layer.

The produced encapsulation film was cut to produce a film for encapsulating an organic electronic element. The physical properties of the sample obtained by irradiating the produced film with ultraviolet rays at 2 J/cm$^2$ are measured.

Comparative Example 2

Preparation of Encapsulation Layer

To prepare a first layer solution, a solution (solid content 33%) in which a butyl rubber resin (BR068, EXXON) and a tackifier (hydrogenated dicyclopentadiene resin with 9 carbon atoms, softening point: 90° C., Mw: 570 g/mol) were diluted at a weight ratio (parts by weight) of 39:56 with toluene was prepared, and then the solution was homogenized. 5 parts by weight of a multifunctional acrylate (HDDA, Miwon) and 1 part by weight of a photoinitiator (Irgacure819, BASF) were introduced to the homogenized solution and homogenized, and then stirred at high speed for 1 hour to prepare a first layer solution.

To prepare a second layer solution, CaO (Sigma-Aldrich, average particle diameter 1 μm) as a moisture adsorbent was prepared as a solution (solid content 50%). In addition, separately from this, a solution (solid content 50%) in which a butyl rubber resin (BR068, EXXON), Ni particles (particle diameter about 300 nm) as a bright spot inhibitor and a tackifier (hydrogenated dicyclopentadiene resin with 9 carbon atoms, softening point: 90° C., Mw: 570 g/mol) were diluted at a weight ratio (parts by weight) of 39:10:56 (butyl rubber:Ni:tackifier) with toluene, respectively, was prepared, and then the solution was homogenized. 5 parts by weight of a multifunctional acrylate (HDDA, Miwon) and 1 part by weight of a photoinitiator (Irgacure819, BASF) were introduced to the homogenized solution and homogenized, and then the moisture adsorbent solution was introduced thereto so that the amount of the moisture adsorbent was 60 parts by weight, and then stirred at high speed for 1 hour to prepare a second layer solution.

The encapsulation layer solution as prepared above was separately applied to the release surface of the release PET using a comma coater for the first layer and the second layer, respectively, dried in a dryer at 130° C. for 3 minutes to form encapsulation layers with thicknesses of 50 μm, respectively, and then two layers were laminated.

Production of Encapsulation Film

On the metal layer (SUS430, thickness 70 μm) prepared in advance, the release-treated PET attached to the second layer of the encapsulation layer was peeled off and laminated at 70° C. by a roll-to-roll process, whereby an encapsulation film was produced so that the second layer was in contact with the metal layer.

The produced encapsulation film was cut to produce a film for encapsulating an organic electronic element. The physical properties of the sample obtained by irradiating the produced film with ultraviolet rays at 2 J/cm$^2$ are measured.

Comparative Example 3

Preparation of Encapsulation Layer

To prepare a first layer solution, a solution (solid content 33%) in which a butyl rubber resin (BR068, EXXON) and a tackifier (hydrogenated dicyclopentadiene resin with 9 carbon atoms, softening point: 90° C., Mw: 570 g/mol) were diluted at a weight ratio (parts by weight) of 60:40 with toluene was prepared, and then the solution was homogenized, followed by stirring at high speed for 1 hour, to prepare a first layer solution.

To prepare a second layer solution, CaO (Sigma-Aldrich, average particle diameter 1 μm) as a moisture adsorbent was prepared as a solution (solid content 50%). In addition, separately from this, a solution (solid content 50%) in which a polyisobutylene resin (PIB, B50, BASF), Ni particles (particle diameter about 300 nm) as a bright spot inhibitor and a tackifier (hydrogenated dicyclopentadiene resin with 9 carbon atoms, softening point: 90° C., Mw: 570 g/mol) were diluted at a weight ratio (parts by weight) of 55:10:40 (PIB:Ni:tackifier) with toluene, respectively, was prepared, and then the solution was homogenized. 5 parts by weight of a multifunctional acrylate (HDDA, Miwon) and 1 part by weight of a photoinitiator (Irgacure819, BASF) were introduced to the homogenized solution and homogenized, and then the moisture adsorbent solution was introduced thereto so that the amount of the moisture adsorbent was 60 parts by weight, and then stirred at high speed for 1 hour to prepare a second layer solution.

The encapsulation layer solution as prepared above was separately applied to the release surface of the release PET using a comma coater for the first layer and the second layer, respectively, dried in a dryer at 130° C. for 3 minutes to form encapsulation layers with thicknesses of 50 μm, respectively, and then two layers were laminated.

Production of Encapsulation Film

On the metal layer (Al, thickness 70 μm) prepared in advance, the release-treated PET attached to the second layer of the encapsulation layer was peeled off and laminated at 70° C. by a roll-to-roll process, whereby an encapsulation film was produced so that the second layer was in contact with the metal layer.

The produced encapsulation film was cut to produce a film for encapsulating an organic electronic element. The physical properties of the sample obtained by irradiating the produced film with ultraviolet rays at 2 J/cm$^2$ are measured.

Comparative Example 4

An encapsulation film was produced in the same manner as in Example 2, except that the encapsulation layer was formed as a single layer of the second layer without preparing the first layer, and the contents of the butyl rubber, tackifier, HDDA, moisture adsorbent, bright spot inhibitor and photoinitiator included in the second layer were changed to a weight ratio (parts by weight) of 30:65:5:60:10:1.

Comparative Example 5

An encapsulation film was produced in the same manner as in Example 4, except that Kolon's Hikorez T-1080 (a thermoplastic resin obtained through copolymerization of CS-based aliphatic olefin and diolefin with C9-based aromatic olefin) was used as the tackifier for the first and second layers.

Comparative Example 6

An encapsulation film was produced in the same manner as in Example 2, except that Arakawa Chemical's SE-50 (softening point: 15° C., hydrogenated rosin ester) was used as the tackifier for the second layer.

Experimental Example 1—Creep Test

The encapsulation layers prepared in Examples and Comparative Examples were each laminated to a thickness of 800 μm to prepare a film sample. For the film sample, a vertical force of 200 gf at 85° C. was applied thereto using an 8 mm aluminum parallel plate cell in the Creep mode with ARES (TA) to load the film sample. After applying a stress of 15,000 Pa to the film sample and maintaining it for 60 seconds, the strain value was measured.

Detailed measurement conditions are as follows.

Conditioning transducer conditions are set as follows,

1. Transducer mode switching check

As transducer mode detailed items, configuration is selected as override, normal force transducer mode is selected as FRT, torque transducer mode is selected as FRT.

2. Motor state/equilibration delay is not checked

3. Transducer zeroing/Range switching check

As zeroing/range detailed items, Range is selected as override, Range selection is selected as Low range, auto range check, Transducer zero time is selected as Standard, zero torque check, zero normal force check is not selected Conditioning stress control is set as follows, 1. Run and calculate check, In Environmental Control, Temperature 85° C., Soak Time 0.0 s, in Test Parameters, Strain % is recorded as 1.0%

In Step(transient) Creep mode,

1. As environmental control detailed items, Temperature 85° C., Soak Time 0.0 s, 2. As detailed items of test parameters, Duration was set to 60.0 s, Stress was set to 15000 Pa, Sampling was set to Log check, Number of points was set to 1500, Steady state sensing check, Tolerance was set to 5.0%, Sample period was set to 30.0, Periods within Tolerance was set to 3.

Experimental Example 2—Elastic Portion

After laminating each of the encapsulation layers prepared in Examples and Comparative Examples to a thickness of 800 μm to prepare a film sample, a normal force of about 150 gf was applied at 85° C. using a parallel plate by means of ARES (Advanced Rheometric Expansion System, TA's ARES-G2) in the stress relaxation (relaxation test) mode to apply a strain of 50% to the film sample, and then the maximum stress value σ1 measured after 1 second was measured. The stress value measurement was performed at 1 second intervals. After maintaining the state where the strain was applied to the film sample for 180 seconds, the stress value σ2 measured at 180 seconds was additionally measured and the elastic portion (Ep) according to the following general formula 2 was calculated.

$$Ep \text{ (unit: \%)} = 100 \times \sigma 2/\sigma 1 \quad \text{[General Formula 2]}$$

In the above measurement, it must be noted that there are no air bubbles when loading the pressure-sensitive adhesive film between the flat plates.

Detailed measurement conditions are as follows.

Conditioning transducer conditions are set as follows,

1. Transducer Mode switching check

As transducer mode detailed items, configuration is selected as override, normal force transducer mode is selected as FRT, torque transducer mode is selected as FRT.

2. Motor state/equilibration delay is not checked

3. Transducer zeroing/Range switching check

As zeroing/range detailed items, Range is selected as override, Range selection is selected as High range, auto range check, Transducer zero time is select as Fast, zero torque check, zero normal force check Conditioning options are set as follows, 1. Mode of axial force adjustment is selected as Disabled 2. As detailed items of auto strain adjustment Mode is selected as Enabled, strain adjust is selected as 20.0%, minimum strain is selected as 1.0e-3%, maximum strain is selected as 100.0%, minimum torque is selected as 4.90333 μN·m, maximum torque is selected as 147100 μN·m In Step(transient) Stress Relaxation mode, 1. As environmental control detailed items, Temperature 85° C., Soak Time 60.0 s, 2. As detailed items of test parameters, Duration was set to 180.0 s, Strain was set to 30.0%, sampling was set to Linear check, and sampling rate was set to 1.0 pts/s.

Experimental Example 3—High-Temperature and High-Humidity Test (Panel End Shape)

After depositing an organic electronic element on a 55-inch glass substrate (0.5 T), the encapsulation films prepared in Examples and Comparative Examples were each bonded together onto the element under conditions of 50° C., vacuum degree of 50 mtorr, and 0.4 MPa using a vacuum bonding machine to produce an organic electronic panel.

The prepared panel is placed into a constant temperature and humidity chamber at 85° C. and 85%, and stored. After 1000 hours, it was taken out and the end of the panel was observed.

When the shape of the encapsulation layer did not change, it was classified as O, and when defects such as bubbles or tears occurred in the encapsulation layer, it was classified as X.

Experimental Example 4—Moisture Barrier Performance

After depositing an organic electronic element on a 55-inch glass substrate (0.5 T), the encapsulation films prepared in Examples and Comparative Examples were each bonded together onto the element under conditions of 50° C., vacuum degree of 50 mtorr, and 0.4 MPa using a vacuum bonding machine to produce an organic electronic panel.

The prepared panel is placed into a constant temperature and humidity chamber at 85° C. and 85%, and stored. After 1000 hours, it is taken out and it is checked by lighting whether or not bright spots and shrinkage of the organic electronic element occur. When the bright spot and element shrinkage did not occur at all, it was classified as O, and when the bright spot defect or element shrinkage occurred, it was classified as X.

TABLE 1

| | | Creep (%) | Ep (%) | High-temperature and high-humidity test | Moisture barrier performance |
|---|---|---|---|---|---|
| Example | 1 | 55 | 25 | ○ | ○ |
| | 2 | 42 | 28 | ○ | ○ |
| | 3 | 37 | 41 | ○ | ○ |
| | 4 | 142 | 22 | ○ | ○ |
| Comparative Example | 1 | 1850 | 7 | X | X |
| | 2 | 150 | 19 | X | X |
| | 3 | 1620 | 10 | X | X |
| | 4 | 320 | 17 | X | X |
| | 5 | 485 | 14 | X | X |
| | 6 | 2610 | 5 | X | X |

Figure 3:
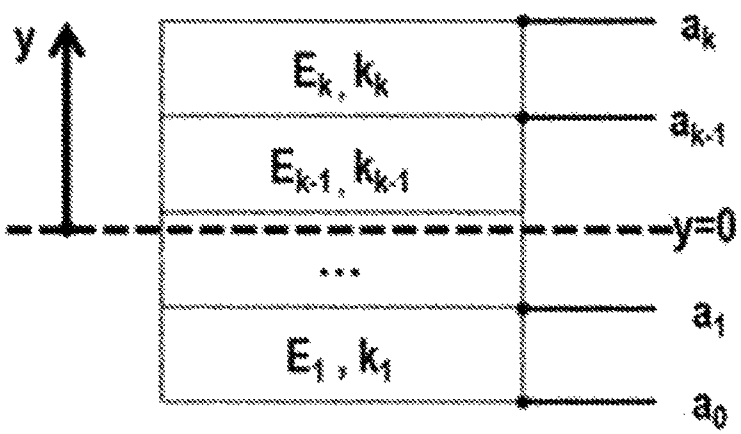
FIGS. 3 and 4 are diagrams of a method for measuring physical properties according to experimental examples of the present disclosure.

Experimental Example 5—Horizontal Direction Thermal Resistance (Rtot) and Bending Stiffness (Dtot) Measurement For the encapsulation films prepared in Examples 5 and 6, horizontal direction thermal resistance (Rtot) and bending stiffness (Dtot) were measured through FIG. 3 and the following general formula 3.

⟨General Formula 3⟩

$$D_{tot} = \frac{1}{3}\sum_{k=1}^{n} E_k\left(a_k^3 - a_{k-1}^3\right)$$

$$\frac{1}{R_{tot}} = \sum_{k=1}^{n} \frac{1}{k_k(a_k - a_{k-1})}$$

FIG. 3 shows a cross-sectional diagram of an encapsulation film having a multi-layered structure, where y=0 is the thickness center of the entire encapsulation film structure.

Here, $a_k$ is the distance from the thickness center of the entire encapsulation film structure to the upper surface of each layer, $E_k$ is the elastic modulus of each layer, and $k_k$ is the thermal conductivity of each layer. Accordingly, n means the number of layers. When the entire encapsulation film structure has been laminated in the order of the metal layer and the encapsulation layer, the metal layer is defined as the upper surface. In addition, even when the encapsulation layer is multi-layered (the first layer and the second layer), the encapsulation layer is counted as one layer.

In the case of Example 5, three layers of a metal layer, an encapsulation layer (second layer) and an encapsulation layer (first layer) as laminated sequentially can be calculated and applied to General Formula 3 above. The respective physical property values corresponding to $E_1$, $k_1$ and $a_1$ related to the encapsulation layer (first layer) were measured; the respective physical property values corresponding to $E_2$, $k_2$ and $a_2$ related to the encapsulation layer (second layer) were measured; and the respective physical property values corresponding to $E_3$, $k_3$ and $a_3$ related to the metal layer were measured. In the case of Example 6, the respective physical property values corresponding to $E_1$, $k_1$ and $a_1$ related to the encapsulation layer (first layer) were measured; the respective physical property values corresponding to $E_2$, $k_2$ and $a_2$ related to the encapsulation layer (second layer) were measured; the respective physical property values corresponding to $E_3$, $k_3$ and $a_3$ related to the metal layer (aluminum) were measured; and the respective physical property values corresponding to $E_4$, $k_4$ and $a_4$ related to the metal layer (SUS) were measured.

The thermal conductivity is measured using a hot disc method (TPS2200) according to the procedure specified in ISO 22007-2. In the case of the encapsulation layer, the thermal conductivity was measured after laminating the prepared encapsulation layer to produce a 1 mm thick sample.

In the case of the metal layer, specimen production and tensile testing was performed according to the procedure of ASTM E8/E8M, and the elastic modulus was derived through the slope in the elastic section in the stress-strain curve (measured at a temperature of 25° C. and a tension rate of 1-10 mm/min, and in an elastic section within a strain of 1%). In the case of the encapsulation layer, the prepared encapsulation layer was laminated to produce a 1 mm thick sample, and then specimen production and tensile testing were performed according to ASTM D638 procedure. In the present application, as the D value increases, bending resistance is increased, whereby bending is suppressed, and as R decreases, heat transfer in a horizontal direction is easy, whereby heat dissipation performance is realized. Accordingly, it can be confirmed that the present application implements desired physical properties through the above ratio.

Experimental Example 6—High-Temperature and High-Humidity Test (Measurement of Bending Displacement)

On a glass substrate (0.5 T) having a size of 200×65 mm, the encapsulation films prepared in Examples 5 and 6 were each bonded together using a vacuum bonding machine under conditions of 50° C., a vacuum degree of 50 mtorr, and 0.4 MPa to produce a panel.

The prepared panel is placed into a constant temperature and humidity chamber at 85° C. and 85%. After 1000 hours, it was taken out and left at room temperature for 10 minutes.

Figure 4:
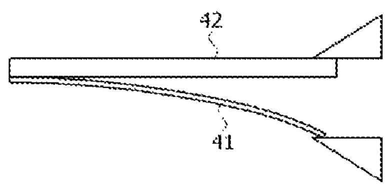

Through vernier calipers, as shown in FIG. 4 below, the bending displacement was measured. One side of the glass substrate (42) and the encapsulation film (41) was fixed, and the maximum displacement of the other side facing each other was measured.

TABLE 2

| | Horizontal thermal resistance (K/W) | Bending stiffness (Pa · m$^3$) | Dtot/Rtot (Pa · m$^3$ · W/K) | Bending displacement (mm) |
|---|---|---|---|---|
| Example 5 | 59.5 | 0.0630 | $1.060 \times 10^{-4}$ | <8 |
| Example 6 | 105.7 | 0.0177 | $1.674 \times 10^{-4}$ | <7 |

The invention claimed is:

1. An encapsulation film comprising an encapsulation layer and a protective layer formed on the encapsulation layer, wherein the protective layer has a coefficient of positive linear thermal expansion (CTE) in machine direction (MD) measured according to American Society for Testing and Materials (ASTM) E831 standard in a range of 6 to 30 ppm/° C., wherein the encapsulation layer comprises an encapsulation resin, wherein the encapsulation resin is included in the encapsulation layer in an amount of 40 wt % or more, and wherein the encapsulation layer has a creep shear strain value of less than 150% as measured, in a state laminated by laminating it to a film sample having a thickness within a range of 750 to 850 μm, after applying to the film sample a vertical force of 200 gf at 85° C. using an 8 mm aluminum parallel plate cell in the Creep mode with ARES (TA) to load the film sample, and applying a shear stress of 15,000Pa to the laminated film sample and maintaining it for 60 seconds, wherein the encapsulation layer further comprises a tackifier, and wherein the tackifier is a compound containing a cyclic structure having a carbon number in a range of 7 to 13, and the cyclic structure is a bicyclic or tricyclic compound.

2. The encapsulation film according to claim 1, wherein the encapsulation layer comprises a moisture adsorbent.

3. The encapsulation film according to claim 2, wherein the moisture adsorbent is included in a range of 20 to 200 parts by weight relative to 100 parts by weight of the encapsulation resin.

4. The encapsulation film according to claim 2, wherein the encapsulation layer further comprises a bright spot inhibitor having an adsorption energy for outgases of 0eV or less, as calculated by an approximation method of the density functional theory.

5. The encapsulation film according to claim 4, wherein as a result of analyzing the particle size of the moisture adsorbent and the bright spot inhibitor contained in the sample passed by dissolving the encapsulation layer in an organic solvent and then filtering it through a 300-mesh nylon filter, the value according to the following general formula 1 is in a range of 2.4 to 3.6:

$$\sqrt{1.8 \times D60 + \frac{D60}{D10} + \frac{D90}{D50}} \quad \text{[General Formula 1]}$$

wherein, D10 is the average particle diameter according to the particle size analysis result D10, D50 is the average particle diameter according to the particle size analysis result D50, and D90 is the average particle diameter according to the particle size analysis result D90, where the particle size analysis is a particle size distribution measured according to ISO13320:2009.

6. The encapsulation film according to claim 4, wherein the bright spot inhibitor is included in an amount of 3 to 150 parts by weight relative to 100 parts by weight of the encapsulation resin.

7. The encapsulation film according to claim 1, wherein the encapsulation resin comprises an olefin-based resin.

8. The encapsulation film according to claim 1, wherein the encapsulation resin comprises a copolymer of diene and an olefin-based compound containing one carbon-carbon double bond.

9. The encapsulation film according to claim 1, wherein the tackifier has a softening point of 70° C. or higher.

10. The encapsulation film according to claim 1, wherein the tackifier is included in a range of 15 to 200 parts by weight relative to 100 parts by weight of the encapsulation resin.

11. The encapsulation film according to claim 1, wherein the encapsulation layer is configured to encapsulate the top surface of an organic electronic element on the substrate having a coefficient of positive linear thermal expansion (CTE) of less than 8 ppm/° C.

12. The encapsulation film according to claim 1, wherein a ratio of a coefficient of positive linear thermal expansion (CTE) of a glass substrate to the coefficient of positive linear thermal expansion (CTE) of the protective layer is in a range of 0.01 to 0.7.

13. The encapsulation film according to claim 1, wherein the protective layer is a metal layer.

14. The encapsulation film according to claim 1, wherein a horizontal direction thermal resistance Rtot is 25 K/W or more, and a ratio of bending stiffness Dtot to the horizontal direction thermal resistance Rtot is $1.3\times10^{-5}$ Pa·m$^3$·W/K or more.

15. An organic electronic device comprising a substrate; an organic electronic element formed on the substrate; and the encapsulation film according to claim 1 for encapsulating the organic electronic element.

16. A method for manufacturing an organic electronic device comprising a step of applying the encapsulation film according to claim 1 to a substrate, on which an organic electronic element is formed, so as to cover the organic electronic element.

* * * * *